United States Patent
Ono et al.

(10) Patent No.: US 7,436,870 B2
(45) Date of Patent: Oct. 14, 2008

(54) SEMICONDUCTOR LASER DEVICE AND METHOD FOR MANUFACTURING THE SAME

(75) Inventors: Kenichi Ono, Tokyo (JP); Masayoshi Takemi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 215 days.

(21) Appl. No.: 11/046,746

(22) Filed: Feb. 1, 2005

(65) Prior Publication Data
US 2005/0271104 A1 Dec. 8, 2005

(30) Foreign Application Priority Data
Jun. 8, 2004 (JP) .............................. 2004-169781

(51) Int. Cl.
*H01S 5/00* (2006.01)
(52) U.S. Cl. ................. 372/43.01; 372/44.01; 372/50.1
(58) Field of Classification Search ................... 372/44, 372/43.01, 44.01
See application file for complete search history.

(56) References Cited

U.S. PATENT DOCUMENTS

| 5,694,410 | A | * | 12/1997 | Motoda et al. ........... 372/46.01 |
| 5,737,351 | A | * | 4/1998 | Ono ....................... 372/46.015 |
| 6,233,266 | B1 | * | 5/2001 | Kawasumi ............... 372/46.01 |
| 6,528,823 | B2 | * | 3/2003 | Akaike et al. .................. 257/79 |
| 6,664,605 | B1 | * | 12/2003 | Akulova et al. ............. 257/432 |
| 6,819,695 | B1 | * | 11/2004 | Akulova et al. .......... 372/45.01 |
| 2003/0132431 | A1 | * | 7/2003 | Hanamaki ..................... 257/14 |
| 2004/0119081 | A1 | * | 6/2004 | Takemi et al. .................. 257/85 |

FOREIGN PATENT DOCUMENTS

| JP | 62-200784 | 9/1987 |
| JP | 11-087832 | 3/1999 |
| JP | 2000-068597 | 3/2000 |

OTHER PUBLICATIONS

K. Mori et al "Band Discontinuity Reduction of i-GaInAsP/p-InP for Improving 1.55 μm GaInAsP/InP Surface Emitting Laser Performances", Tokyo Institute of Technology, Precision and Intelligence Lab. Japan.*

F. Brunner et al., "Carbon doping for the GaAs base layer of Heterojunction Bipolar Transistors in a production scale MOVPE reactor", Jounral of Crystal Growth, 2000, pp. 53-58, vol. 221.

* cited by examiner

*Primary Examiner*—Minsun Harvey
*Assistant Examiner*—Yuanda Zhang
(74) *Attorney, Agent, or Firm*—Leydig, Voit & Mayer, Ltd.

(57) ABSTRACT

A semiconductor laser device includes: an n-type cladding layer, an active layer, and a p-type cladding layer, each being a III-V group compound semiconductor, supported on a substrate of n-type GaAs, a p-type band discontinuity reduction layer of a III-V group compound semiconductor on the p-type cladding layer, and a p-type GaAs cap layer on the band discontinuity reduction layer. The p-type cladding layer, the p-type band discontinuity reduction layer, and the p-type cap layer are each doped with a p-type dopant which is lower in diffusivity than Zn. The p-type band discontinuity reduction layer has a concentration of a p-type dopant lower in diffusivity than Zn of $2.5 \times 10^{18}$ cm$^{-3}$ or higher to attain desired device characteristics, for example, high power output and efficiency.

10 Claims, 9 Drawing Sheets

SEMICONDUCTOR LASER DEVICE AND METHOD FOR MANUFACTURING THE SAME

BACKGROUND OF THE INVENTION

1. Field of the Invention

The present invention relates to a semiconductor laser device and a method for manufacturing the device, which is formed of a III-V group compound semiconductor, such as $Al_xGa_yAs_{1-x-y}$ ($0 \leq x \leq 1$, $0 \leq y \leq 1$) or $Al_xGa_yIn_zP_{1-x-y-z}$ ($0 \leq x \leq 1$, $0 \leq y \leq 1$, $0 \leq z \leq 1$) and suitably used for fields of optical recording, optical reproducing, optical communication, optical measurement, etc.

2. Description of the Related Art

In recent years, a vast amount of information has been processed by an information communication machine, and a recording machine/medium having a high speed and a large-capacity is highly demanded. In a DVD-R/RW drive unit, for example, used is a red semiconductor laser with high output and efficiency and an oscillation wavelength of about 650 nm. Faster processing requires a semiconductor laser with higher output and efficiency. Nowadays, an AlGaInP-based semiconductor laser with an optical output of 200 mW or more is under development.

FIG. 9 is a sectional view showing an example of a conventional semiconductor laser device. On a substrate 57 of an n-type GaAs, formed are an n-type buffer layer 56, an n-type cladding layer 55, an active layer 54, a p-type cladding layer 53, a p-type BDR (Band Discontinuity Reduction) layer 52, and a p-type cap layer 51, in this sequence using MOCVD (Metal Organic Chemical Vapor Deposition).

On the upper face of the p-type cap layer 51, a p-side electrode (not shown) is provided, and on the lower face of the substrate 57, an n-side electrode (not shown) is provided.

The n-type buffer layer 56 is formed of a GaAs semiconductor doped with Si (silicon) as an n-type dopant.

The n-type cladding layer 55 is formed of an AlGaInP semiconductor doped with Si as an n-type dopant.

The active layer 54 has a MQW (Multiple Quantum Wells) structure in which barrier layers 54a and well layers 54b are alternately laminated and optical guide layers 54c are formed on both the outer sides. The barrier layers 54a are formed of an AlGaInP semiconductor, the well layers 54b are formed of a GaInP semiconductor, the optical guide layers 54c are formed of an AlGaInP semiconductor, and these layers are non-doped layers without any dopant.

The p-type cladding layer 53 is formed of an AlGaInP semiconductor doped with Zn (zinc) as a p-type dopant.

The p-type BDR layer 52 is formed of a GaInP semiconductor doped with Zn as a p-type dopant.

The p-type cap layer 51 is formed of a GaAs semiconductor doped with Zn as a p-type dopant.

Generally, the p-type BDR layer 52 has a concentration of dopant nearly equal to that of the p-type cladding layer 53. For example, the p-type BDR layer 52 and the p-type cladding layer 53 have the carrier concentration of $1.5 \times 10^{18}$ cm$^{-3}$.

The p-type cap layer 51 generally has a higher concentration of dopant of, e.g., $2.0 \times 10^{19}$ cm$^{-3}$ so as to attain a better ohmic contact with the p-side electrode.

The related prior arts are listed as follows: Japanese Patent Examined Publication (kokoku) JP-B-7-32285 (1996), and Japanese Patent Unexamined Publications (kokai) JP-A-11-87832 (1999), JP-A-2000-68597, and "F. Brunner, et al., Journal of Crystal Growth 221 (2000) pp. 53-58."

Zn used for the p-type dopant has properties of being easily diffused in a process of crystal growth or heating. Therefore, Zn doped in the p-type cap layer 51 is diffused inside of the p-type BDR layer 52 and also into the p-type cladding layer 53 according to the gradient of the dopant concentration, thereby increasing not only the dopant concentration of the p-type BDR layer 52 but also the dopant concentration of the p-type cladding layer 53. If the Zn-diffusion proceeds thorough the p-type cladding layer 53 to the non-doped active layer 54, the active layer 54 has a nonluminous recombination center inside, thereby degrading the laser characteristics.

In order to suppress this phenomenon, conventionally, by reducing the carrier concentration of each p-type layer having a large resistance, i.e., the p-type cap layer 51, the p-type BDR layer 52 and the p-type cladding layer 53, the Zn-diffusion into the active layer 54 and the degradation of the laser characteristics are suppressed.

However, in case the carrier concentration of each p-type layer is lowered too much, the resistance of the device may be increased and the discontinuity of the conduction band ($\Delta Ec$) near the interface of the active layer 54 may be lowered, causing an increase of the operation current at a high temperature.

Meanwhile, Mg acting as the p-type dopant has a diffusion factor smaller than that of Zn, but when doping a GaAs layer with Mg so as to keep a mirror surface without surface irregularities, the maximum doping amount is thought to be nearly equal to $1.5 \times 10^{19}$ cm$^{-3}$. Since this level of the doping amount hardly attain a low contact resistance between the p-type cap layer 51 and the p-side electrode, another device structure, in which Zn is used for the p-type dopant in the p-type cap layer 51 and Mg is used in the other p-type layers (the p-type BDR layer 52 and the p-type cladding layer 53), is also employed.

In this device structure, since the p-type dopant remaining near the active layer 54 is low-diffusive Mg, diffusion of the dopant into the active layer 54 may be inhibited even if a high concentration of the p-type dopant remains near the active layer 54. However, both Zn being doped in the p-type cap layer 51 and Mg being doped in the p-type BDR layer 52 and the p-type cladding layer 53 belong to the same II-group element and have the same mechanism of the dopant diffusing into a crystal. Consequently, such a diffusion phenomenon reportedly occurs that Zn and Mg can mutually diffuse into the crystal at a extremely high speed.

FIG. 4 is a graph showing an example of profiles on concentration of each dopant. As shown in FIG. 4, Zn doped in the p-type cap layer 51 can reach near the active layer 54. A large amount of Zn is likely to concentrate into the active layer 54 as heat cycle is repeated, thereby increasing the nonluminous recombination centers inside the active layer 54 and degrading the laser characteristics.

Another concept of a Zn-free semiconductor laser device structure (excluding Zn) is proposed against such a background, in which a low diffusive dopant, alternative to Zn, is doped in all the p-type layers (the p-type cap layer 51, the p-type BDR layer 52, and the p-type cladding layer 53 in FIG. 9). In case C (carbon) is doped in a GaAs layer, for example, C is thought to has a extremely low diffusion factor and hardly diffuse even after repetition of heat cycle.

In case the p-type cap layer 51 is doped with C and the p-type BDR layer 52 and the p-type cladding layer 53 are doped with Mg, mutual diffusion of the same group element cannot occur because C (carbon) belongs to the IV group element.

However, if the p-type BDR layer 52 has a small doping amount of Mg, the resistance of the device is increased due to reduction of the carrier concentration in the interface between the GaAs layer and the GaInP layer.

As described above, in the combination of the Zn-doped p-type GaAs cap layer and the Zn-doped p-type GaInP BDR layer and the other combination of the Zn-doped p-type GaAs cap layer and the Mg-doped p-type GaInP BDR layer, either Zn in the cap layer may diffuse into the BDR layer or Zn and Mg may mutually diffuse, so that a extremely higher concentration of the p-type dopant tends to distribute in the vicinity of the interface between the GaAs layer and the GaInP layer, as compared to the predeterminate concentration of the dopant.

FIG. 4 shows the combination of the Zn-doped p-type GaAs cap layer and the Mg-doped p-type GaInP BDR layer. The predeterminate concentration of Mg in the BDR layer is $1.5 \times 10^{18}$ cm$^{-3}$, but the actual line shows a concentration higher than $1.5 \times 10^{18}$ cm$^{-3}$ due to Zn-diffusion from the cap layer.

Meanwhile, FIG. 3 shows yet another combination of the C-doped p-type cap layer and the Mg-doped p-type BDR layer. Since C has a low diffusion factor and does not mutually diffuse, diffusion of the p-type dopant hardly occur in the vicinity of the hetero-interface between the cap layer and the BDR layer. Therefore, in case the p-type BDR layer 52 has a small doping amount of the p-type dopant, the carrier concentration on the hetero-interface is reduced, thereby causing increases of the resistance and the differential resistance of the device (see FIG. 5).

SUMMARY OF THE INVENTION

An object of the present invention is to provide a semiconductor laser device and a method for manufacturing the device, which has a desired device characteristics with high output and efficiency by suppressing the increases of the resistance and the differential resistance of the device due to the band discontinuity, even in case a p-type layer is doped with a low diffusive dopant.

A semiconductor laser device according to the present invention, includes:

an n-type cladding layer, an active layer and a p-type cladding layer, each formed of a III-V group compound semiconductor over a substrate of an n-type GaAs; and a cap layer of a p-type GaAs, formed via a p-type band discontinuity reduction layer of a III-V group compound semiconductor on the p-type cladding layer;

wherein the p-type cladding layer, the p-type band discontinuity reduction layer and the p-type cap layer are doped with a p-type dopant which is lower in diffusivity than Zn, and the p-type band discontinuity reduction layer has a concentration of the p-type dopant of $2.5 \times 10^{18}$ cm$^{-3}$ or higher.

Further, a semiconductor laser device according to the present invention, includes:

an n-type cladding layer, an active layer and a p-type cladding layer, each formed of a III-V group compound semiconductor over a substrate of an n-type GaAs; and a cap layer of a p-type GaAs, formed via a p-type band discontinuity reduction layer of a III-V group compound semiconductor on the p-type cladding layer;

wherein the p-type cladding layer, the p-type band discontinuity reduction layer and the p-type cap layer are doped with a p-type dopant which is lower in diffusivity than Zn, and the p-type band discontinuity reduction layer includes a higher concentration layer, adjacent to the p-type cap layer, with a concentration of the p-type dopant of $2.5 \times 10^{18}$ cm$^{-3}$ or higher, and a lower concentration layer with a lower concentration of the p-type dopant than that of the higher concentration layer.

The higher concentration layer of the p-type band discontinuity reduction layer preferably has a thickness of 20% to 80% of the total thickness of the p-type band discontinuity reduction layer.

The p-type cladding layer is preferably doped with Be or Mg as the p-type dopant, the p-type band discontinuity reduction layer is preferably doped with Be or Mg as the p-type dopant, and the p-type cap layer is preferably doped with C, Be, or Mg as the p-type dopant.

In the above-mentioned semiconductor laser device, GaAs, AlGaAs, AlGaInP, or GaInP is preferably used for the III-V group compound semiconductor.

A method for manufacturing a semiconductor laser device according to the present invention, includes:

a step for forming an n-type cladding layer, an active layer and a p-type cladding layer of a III-V group compound semiconductor, respectively, over a substrate of an n-type GaAs;

a step for forming a p-type band discontinuity reduction layer of a III-V group compound semiconductor on the p-type cladding layer;

a step for doping the p-type band discontinuity reduction layer with a p-type dopant while halting the crystal growth process; and a step for forming a cap layer of a p-type GaAs on the p-type band discontinuity reduction layer.

In the above-mentioned method, the p-type cladding layer, the p-type band discontinuity reduction layer and the p-type cap layer are preferably doped with a p-type dopant which is lower in diffusivity than Zn.

According to the present invention, since the p-type band discontinuity reduction layer has a concentration of the p-type dopant of $2.5 \times 10^{18}$ cm$^{-3}$ or higher, the resistance and the differential resistance of the device can be reduced, thereby attaining a semiconductor laser device with high output and efficiency.

BRIEF DESCRIPTION OF THE DRAWINGS

FIG. 5A shows a general I-V characteristics, FIG. 5B shows differential resistance characteristics of a conventional semiconductor laser device, and FIG. 5C shows differential resistance characteristics of the semiconductor laser device according to this embodiment.

DETAILED DESCRIPTION OF THE PREFERRED EMBODIMENTS

This application is based on an application No. 2004-169781 filed on Jun. 8, 2004 in Japan, the disclosure of which is incorporated herein by reference.

Hereinafter, preferred embodiments will be described with reference to drawings.

Embodiment 1

Figure 1:
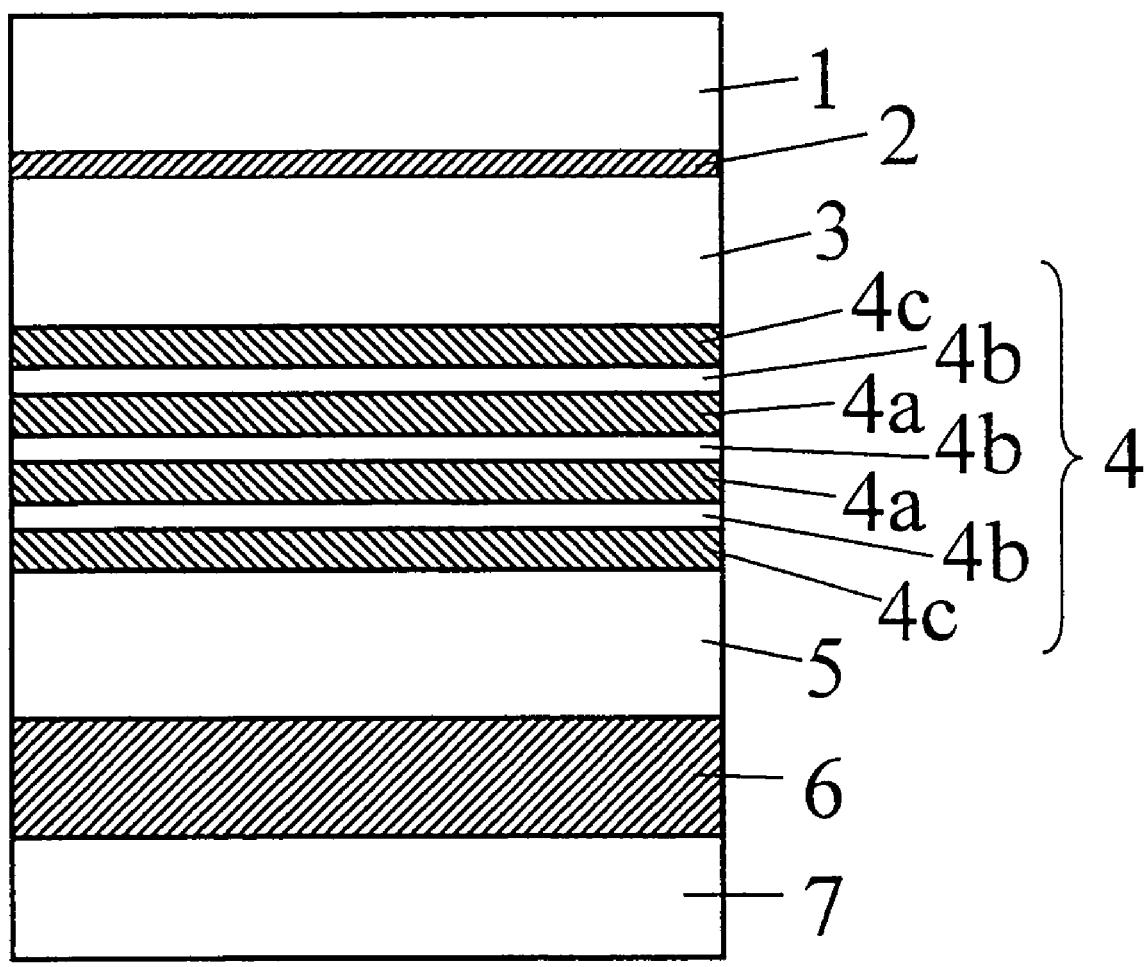
FIG. 1 is a sectional view showing the first embodiment according to the present invention.

FIG. 1 is a sectional view showing the first embodiment according to the present invention. This embodiment exemplifies an AlGaInP/GaAs-based semiconductor laser device which can emit light with a wavelength of about 650 nm, suitably for a DVD-R/RW drive unit or the like. The present invention also can be applied to another type of semiconductor laser device formed of a III-V group compound semiconductor, such as GaAs, AlGaAs, AlGaInP, GaInP, etc.

As shown in FIG. 1, on a substrate 7 of an n-type GaAs, formed are an n-type buffer layer 6, an n-type cladding layer 5, an active layer 4, a p-type cladding layer 3, a p-type BDR (Band Discontinuity Reduction) layer 2, and a p-type cap layer 1, in this sequence using MOCVD (Metal Organic Chemical Vapor Deposition), MBE (Molecular Beam Epitaxy) or the like.

On the upper face of the p-type cap layer 1, a p-side electrode (not shown) is provided, and on the lower face of the substrate 7, an n-side electrode (not shown) is provided.

The n-type buffer layer 6 is formed of a GaAs semiconductor doped with Si (silicon) as an n-type dopant. This embodiment exemplifies the n-type buffer layer 6 having a single layer of GaAs. The n-type buffer layer 6 may have a plurality of layers including one or more AlGaAs layers.

The n-type cladding layer 5 is formed of an AlGaInP semiconductor doped with Si as an n-type dopant.

The active layer 4 has a MQW (Multiple Quantum Wells) structure in which barrier layers 4a and well layers 4b are alternately laminated and optical guide layers 4c are formed on both the outer sides. The barrier layers 4a are formed of an AlGaInP semiconductor, the well layers 4b are formed of a GaInP semiconductor, the optical guide layers 4c are formed of an AlGaInP semiconductor, and these layers are non-doped layers without any dopant. The emission wavelength of the active layer 4 can be varied by adjusting the compositions of the barrier layers 4a and the well layers 4b, for example, so as to obtain red laser light of about 650 nm.

The p-type cladding layer 3 is formed of an AlGaInP semiconductor doped with Mg (magnesium) as a p-type dopant.

The p-type BDR layer 2 is formed of a GaInP semiconductor doped with Mg as a p-type dopant.

The p-type cap layer 1 is formed of a GaAs semiconductor doped with C (carbon) as a p-type dopant.

In case of MOCVD, it can be performed under deposit conditions of, e.g., a growth temperature of 700 degree-C. and a growth pressure of 100 mbar (hPa). As a source gas for forming each layer, for example, trimethyl-indium (TMI) gas, trimethyl-gallium (TMG) gas, trimethyl-aluminum (TMA) gas, phosphine ($PH_3$) gas, arsine ($AsH_3$) gas, silane ($SiH_4$) gas, and cyclopentadienyl-magnesium ($Cp_2Mg$) gas can be used.

The flow rate of each source gas supplied to the MOCVD reactor can be controlled at a desired timing by a mass flow controller (MFC), so that each layer can be formed with a desired composition.

Incidentally, in order to dope the p-type cap layer 1, which is finally deposited, with C (carbon) as a p-type dopant, a method of using carbon tetrabromide ($CBr_4$) as a dopant gas or an intrinsic doping method with no dopant gas can be employed.

In general, a typical GaAs layer is deposited at growth temperature of 600 to 750 degree-C. and flow ratio of V/III (flow ratio of $AsH_3$ to TMG) of several tens to several hundreds while controlling a flow of dopant gas. In the intrinsic doping method (F. Brunner, et al., Journal of Crystal Growth 221 (2000), pp. 53-58), on the other hand, supplying a large amount of TMG alternative to the dopant gas for doping allows a carbon element, which is isolated from the intrinsic methyl group in TMG, to act as a dopant, e.g., at the growth temperature of 542 degree-C. and the flow ratio of V/III of 1, respectively.

Figure 3:
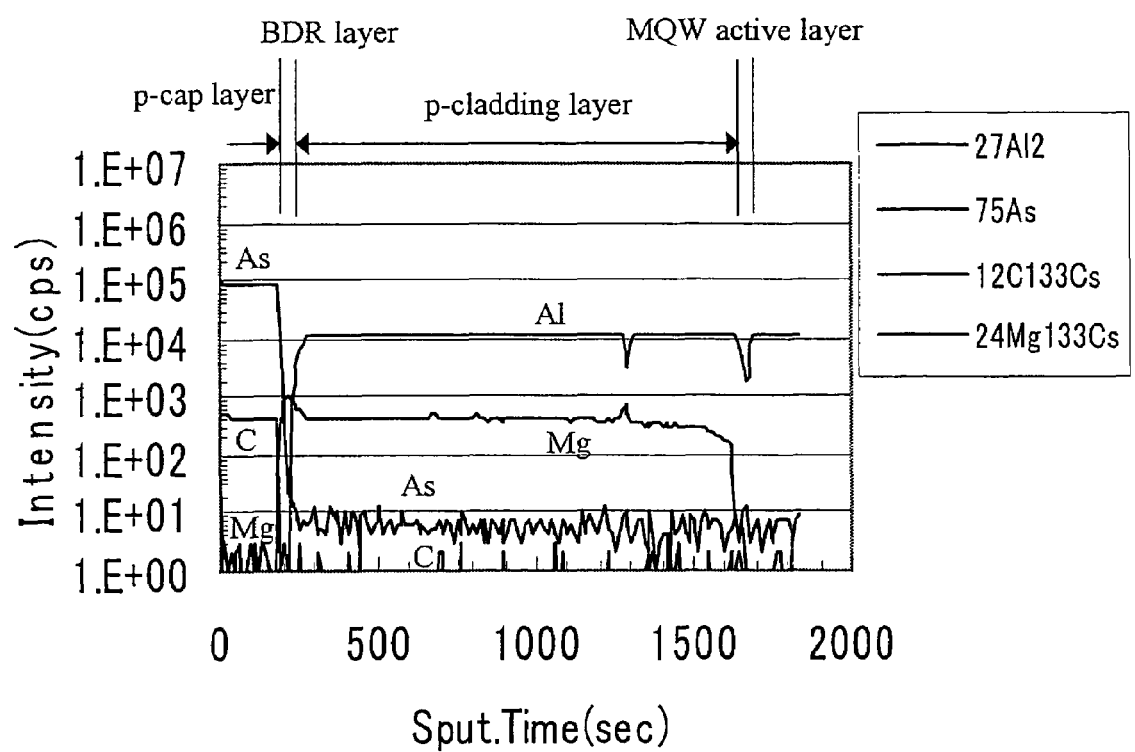
FIG. 3 is a graph showing an example of SIMS profiles of the dopant concentration.
Figure 4:
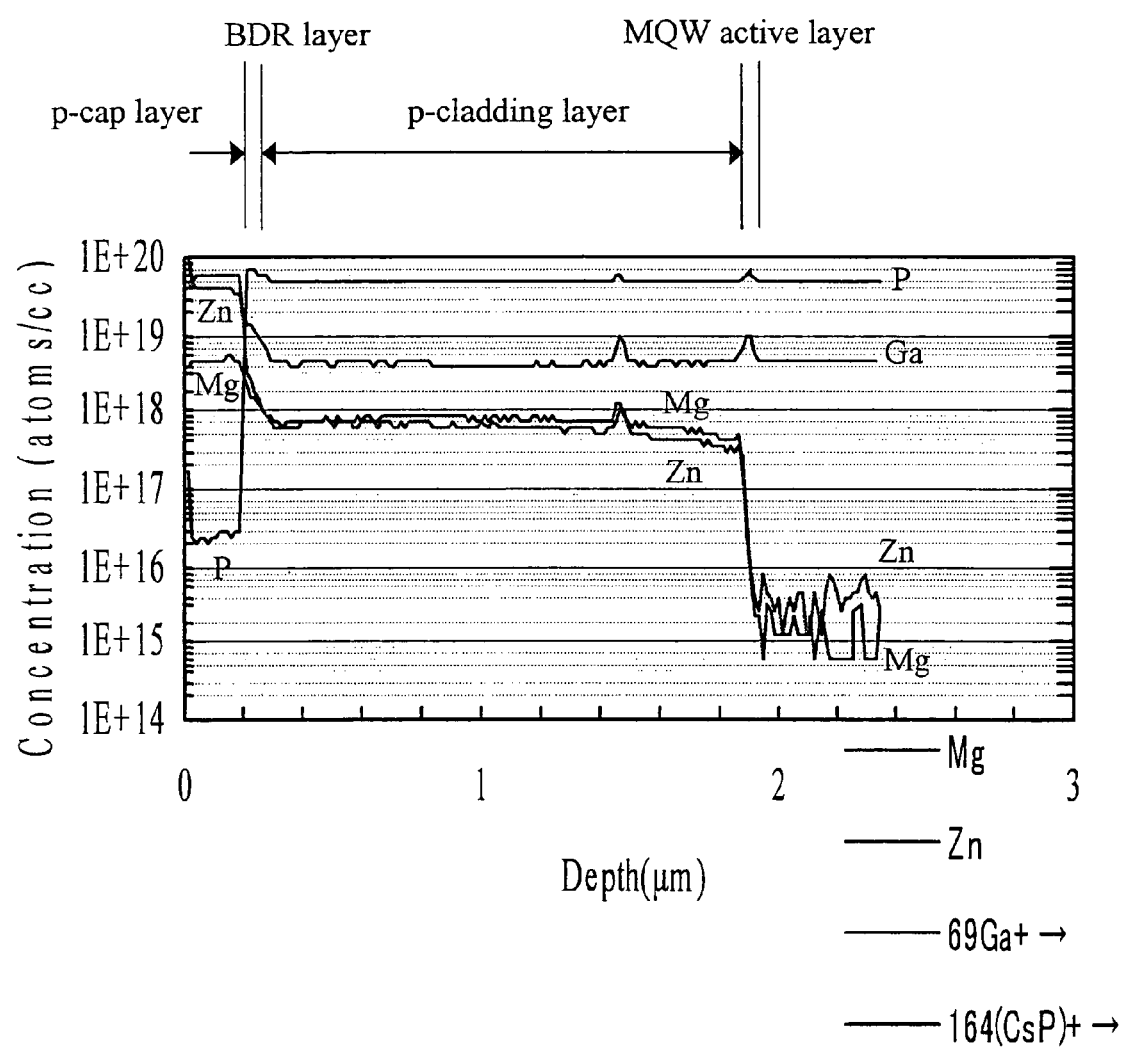
FIG. 4 is a graph showing an example of profiles of concentration of each dopant.

FIG. 3 is a graph showing an example of SIMS (Secondary Ion-microprobe Mass Spectrometer) profiles on the dopant concentration. In case C (carbon) is used for the dopant in the p-type cap layer 1, C is not diffused into the active layer 4 since C has a diffusion factor lower than that of Zn. In addition, such a mutual diffusion phenomenon of Zn and Mg as describe above does not occur since C belongs to the IV group element.

The flow rate of the dopant gas $Cp_2Mg$ is so controlled in deposition that the dopant concentration of the p-type BDR layer 2 is $2.5 \times 10^{18}$ $cm^{-3}$ or more, thereby reducing the resistance of the p-type BDR layer 2.

Figure 5:
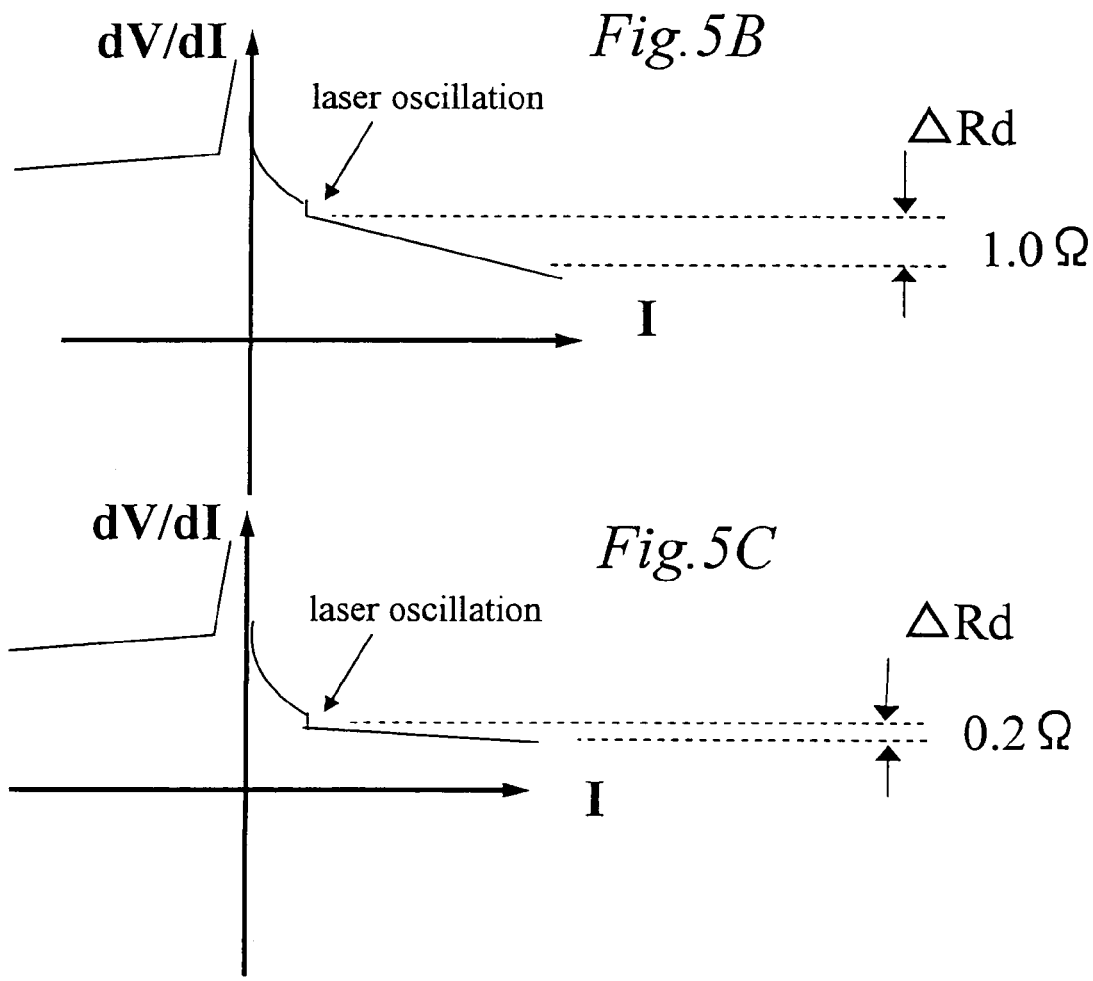
FIGS. 5A to 5C are graphs showing electrical characteristics of an AlGaInP-based semiconductor laser device, where

FIGS. 5A to 5C are graphs showing electric characteristics of an AlGaInP-based semiconductor laser device, where FIG. 5A shows a general I-V characteristics, FIG. 5B shows differential resistance characteristics of a conventional semiconductor laser device, and FIG. 5C shows differential resistance characteristics of the semiconductor laser device according to this embodiment.

First, in FIG. 5A, when an increasing voltage V (vertical axis) exceeds a certain threshold, laser oscillation occurs and a current I (horizontal axis) is increased linearly.

FIGS. 5B and 5C show each differential resistance (dV/dI), that is, the voltage V differentiated by the current I. In the comparative example of FIG. 5B, since the dopant concentration of the p-type BDR layer is $1.5 \times 10^{18}$ $cm^{-3}$, the differential resistance (dV/dI) is relatively high, and the difference of differential resistance ($\Delta Rd$) between the threshold current and the maximum permissible current shows 1.0 ohm.

Meanwhile, in FIG. 5C, since the dopant concentration of the p-type BDR layer 2 is $2.5 \times 10^{18}$ $cm^{-3}$ or more, the differential resistance (dV/dI) becomes lower, and the difference of differential resistance ($\Delta Rd$) between the threshold current and the maximum permissible current is significantly reduced down to 0.2 ohm.

Embodiment 2

Figure 2A:
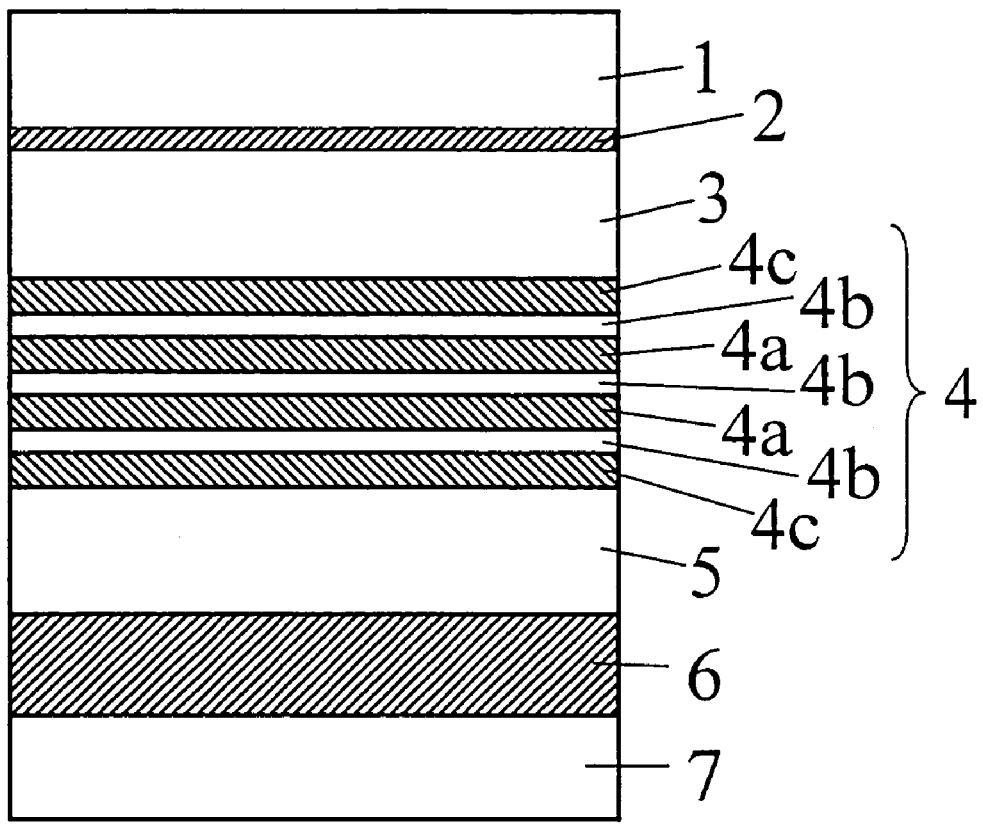
FIG. 2A is a sectional view showing the second embodiment according to the present invention.
Figure 2B:
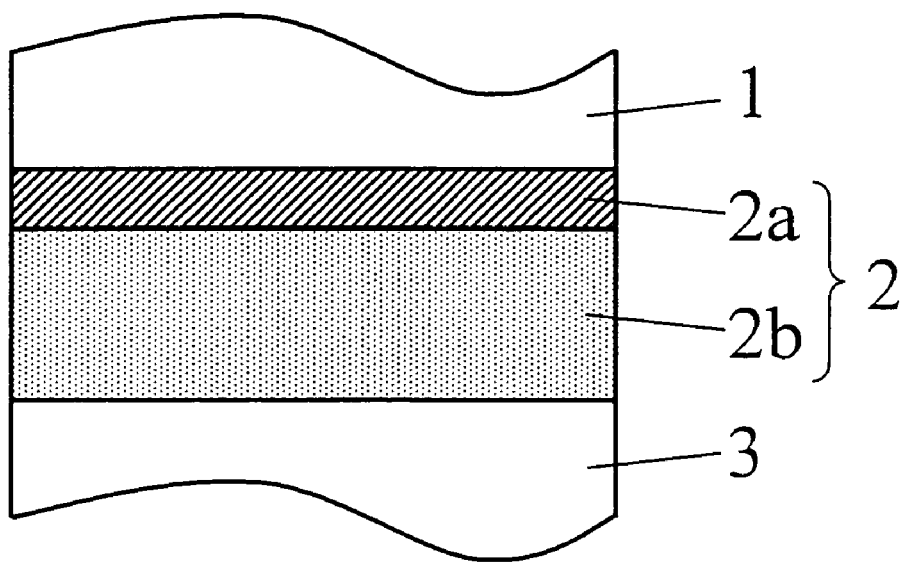
FIG. 2B is an enlarged view showing the vicinity of a p-type BDR layer

FIG. 2A is a sectional view showing the second embodiment according to the present invention. FIG. 2B is an enlarged view showing the vicinity of the p-type BDR layer 2. In this embodiment, the p-type BDR layer 2 is configured of a plurality of layers in the device structure as shown in FIG. 1.

As for the whole structure, as shown in FIG. 2A, on the substrate 7 of an n-type GaAs, formed are the n-type buffer layer 6, the n-type cladding layer 5, the active layer 4, the p-type cladding layer 3, the p-type BDR layer 2, and the p-type cap layer 1, in this sequence using MOCVD, MBE or the like. On the upper face of the p-type cap layer 1, a p-side electrode (not shown) is provided, and on the lower face of the substrate 7, an n-side electrode (not shown) is provided.

Each layer except for the p-type BDR layer 2 is the same as in FIG. 1, the redundant description will be omitted below.

The p-type BDR layer 2 is formed of a GaInP semiconductor doped with Mg as a p-type dopant. The p-type BDR layer 2 includes a higher concentration layer 2a with a higher concentration of the p-type dopant, and a lower concentration layer 2b with a lower concentration of the p-type dopant than that of the higher concentration layer 2a. The total thickness D of the p-type BDR layer 2 is generally designed in a range of 50 to 200 nm.

The higher concentration layer 2a having a p-type dopant concentration of $2.5 \times 10^{18}$ cm$^{-3}$ or more, is located adjacent to the p-type cap layer 1. The thickness Da of the higher concentration layer 2a is so designed in a range of 10 to 160 nm, as to correspond to 20% to 80% of the total thickness D.

The lower concentration layer 2b, having a doping concentration of, e.g., approximately $1.5 \times 10^{18}$ cm$^{-3}$, lower than that of the higher concentration layer 2a, is located adjacent to the p-type cladding layer 3. The thickness Db of the lower concentration layer 2b corresponds to a value obtained by subtracting the thickness Da from the total thickness D.

In case the p-type BDR layer 2 is formed of a single layer with a dopant concentration of $2.5 \times 10^{18}$ cm$^{-3}$ or more, as shown in FIG. 1, the p-type dopant existing near the hetero interface with the p-type cladding layer 3 may diffuse into the active layer 4.

In this embodiment, the dopant concentration near the hetero interface with the p-type cladding layer 3 is designed lower and the dopant concentration at a region far from the active layer 4 is designed higher. This configuration can maintain a lower differential resistance and suppress the diffusion phenomenon of the p-type dopant into the active layer 4, thereby preventing degrading of the laser characteristics.

Further, the thickness Da of the higher concentration layer 2a is preferably designed in a range of 20% to 80% of the total thickness D of the BDR layer, thereby effectively reducing the differential resistance.

As disclosed in Japanese unexamined patent publication JP-A-11-87832 (1999), a structure in which a BDR layer is configured of two or more layers having each composition varying stepwise can effectively reduce the differential resistance of the device. In this case, solid solubility of dopant at a region adjacent to a cap layer is generally highest (in a case, for example, a cladding layer has a composition of $Al_{0.35}Ga_{0.15}In_{0.5}P$ and a part of the BDR layer adjacent to the cap layer has a composition of $Ga_{0.5}In_{0.5}P$). Therefore, it is an effective approach to design this part with a higher concentration for suppressing an inactive dopant which is not located at a regular lattice position. An occupancy percentage of this region to the total BDR layer is made in a range of 20% to 80% by changing the composition, therefore the higher concentration region is also in this range.

This embodiment exemplifies the BDR layer having two or more sorts of compositions. Even in another case the BDR layer has a single composition, it is also an effective approach for the purpose as described above to design only this region adjacent to the cap layer with a higher concentration for suppressing the dopant diffusion into the cladding layer.

For easy understanding, this embodiment exemplifies the p-type BDR layer 2 having two layers of both the higher concentration layer 2a and the lower concentration layer 2b. The p-type BDR layer 2 may include three or more layers having each p-type dopant concentration varying stepwise, or have an internal structure in which the dopant concentration is monotonously decreased toward the active layer 4, thereby obtaining similar effects.

Figure 8:
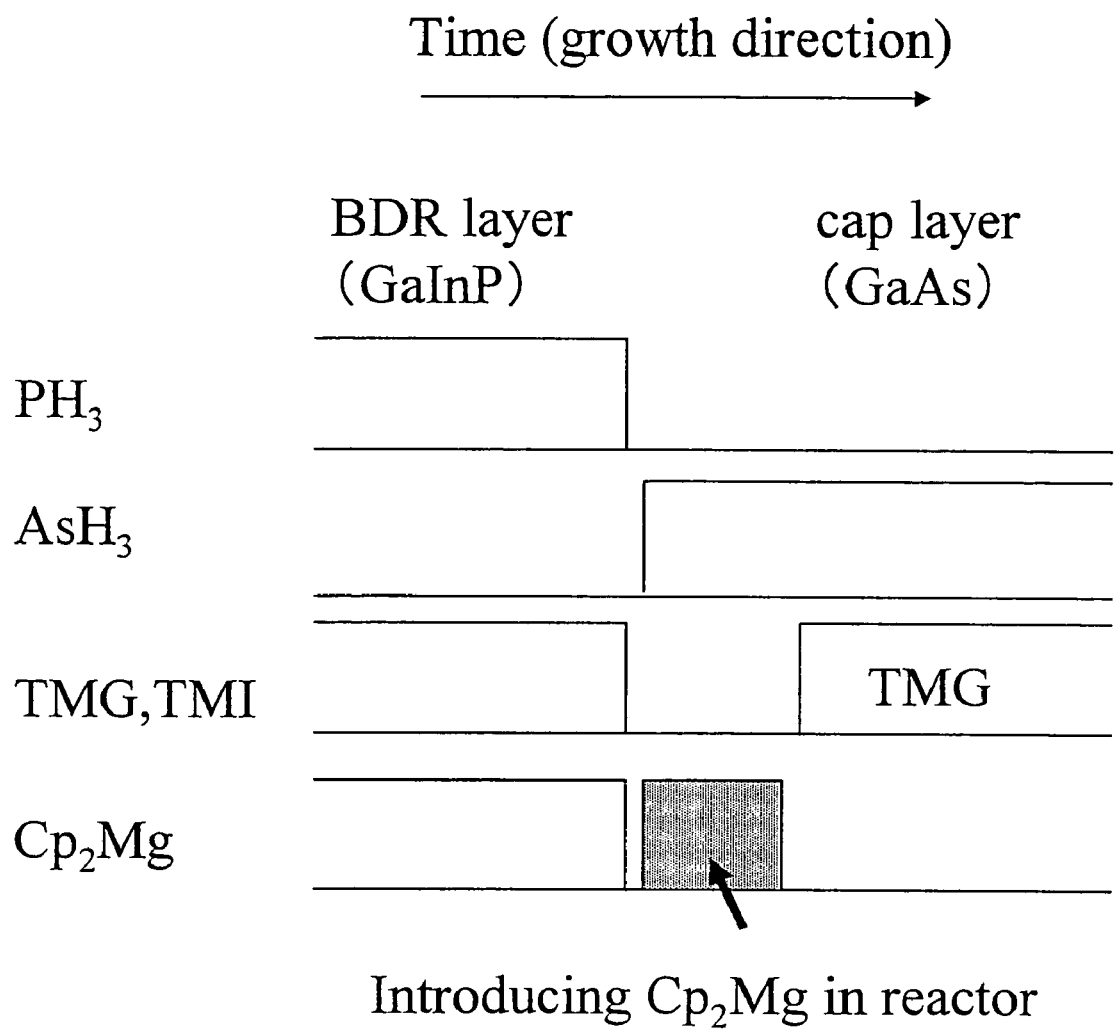
FIG. 8 is a explanatory diagram showing an example of process for manufacturing the semiconductor laser device according to the present invention.
Figure 9:
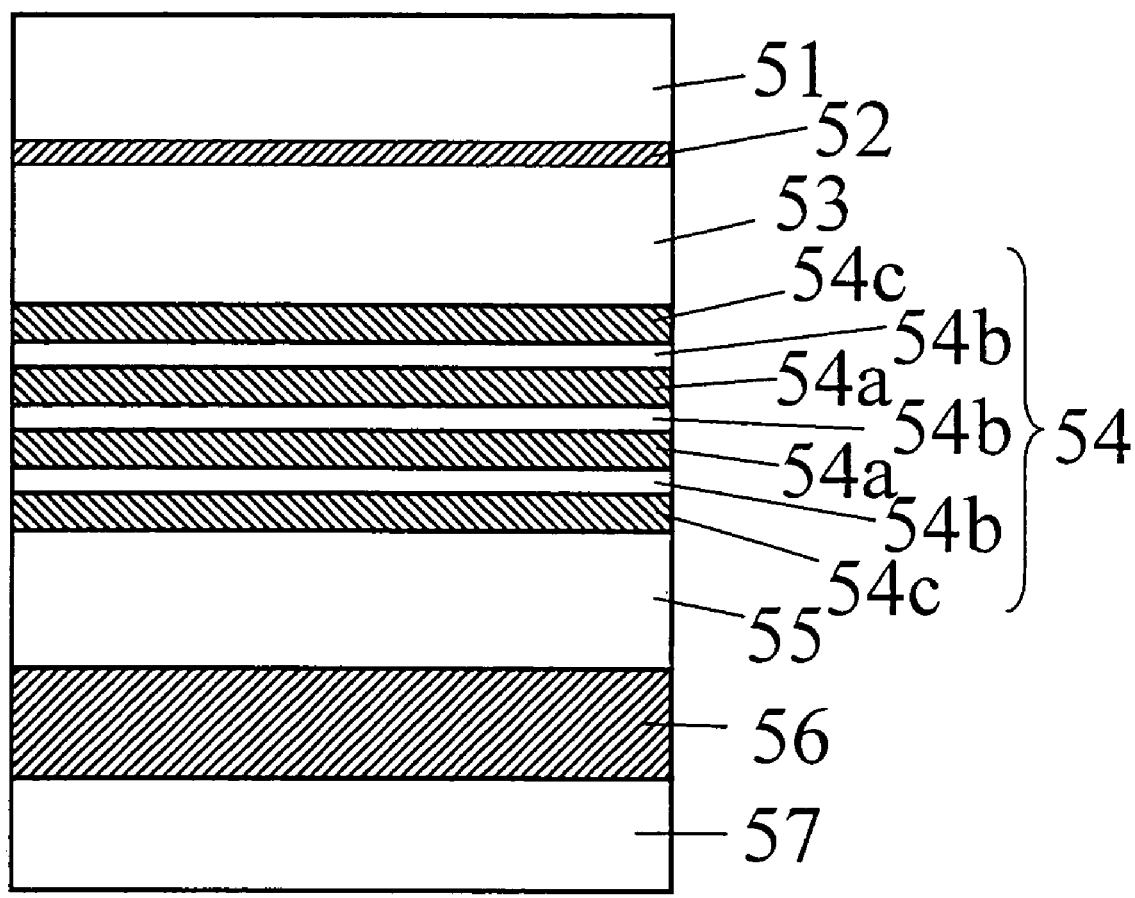
FIG. 9 is a sectional view showing an example of a conventional semiconductor laser device.

FIG. 8 is a explanatory diagram showing an example of process for manufacturing the semiconductor laser device according to the present invention. The horizontal axis shows elapsed time corresponding to a growth direction. The vertical axis shows on/off operation of supplying each source gas.

In case of manufacturing such a device structure as shown in FIG. 2A, the substrate 7 of an n-type GaAs is put in an MOCVD reactor, and while maintaining a predetermined temperature of the substrate, TMG and arsine, TMA if desired, and silane as a dopant gas are supplied to deposit the n-type buffer layer 6 of GaAs or AlGaAs.

Next, after halting the supply of arsine, TMA, TMG, TMI, phosphine and silane as a dopant gas are supplied to deposit the n-type cladding layer 5 of AlGaInP.

Next, after halting the dopant gas, the supply and the halt of TMA are repeated to deposit the optical guide layers 4c of AlGaInP, the well layers 4b of GaInP, and the barrier layers 4a of AlGaInP, respectively, forming the active layer 4.

Next, TMA, TMG, TMI, phosphine and Cp$_2$Mg as a dopant gas are supplied to deposit the p-type cladding layer 3 of AlGaInP.

Next, the supply of TMA is halted to deposit the p-type BDR layer 2 of GaInP.

Next, while halting the supply of all the source gas for each layer, Cp$_2$Mg as a dopant gas are supplied to form the higher concentration layer 2a having a p-type dopant concentration on the cap layer side of the p-type BDR layer 2, as shown in FIG. 2A. At this time, as shown in FIG. 8, the supply of arsine may start.

Next, each supply of TMG and arsine start, and a large amount of TMG is supplied in case of employing the intrinsic doping method, to deposit the p-type cap layer 1 of GaAs doped with C (carbon) as a dopant.

Thus, the higher concentration layer 2a having a higher dopant concentration can be easily formed in the vicinity of the interface between the p-type BDR layer 2 and the p-type cap layer 1.

This embodiment exemplifies usage of MOCVD. In case of using MBE, each source supply for each layer and each dopant is turned on and off using shutter or the like to form such a lamination structure in which each layer has a desired thickness and a desired dopant concentration. Specifically, in a process for depositing the p-type BDR layer 2, by changing the feeding rate of the dopant source, the higher concentration layer 2a having a higher dopant concentration can be easily formed in the vicinity of the interface with the p-type cap layer 1.

Embodiment 3

Figure 6:
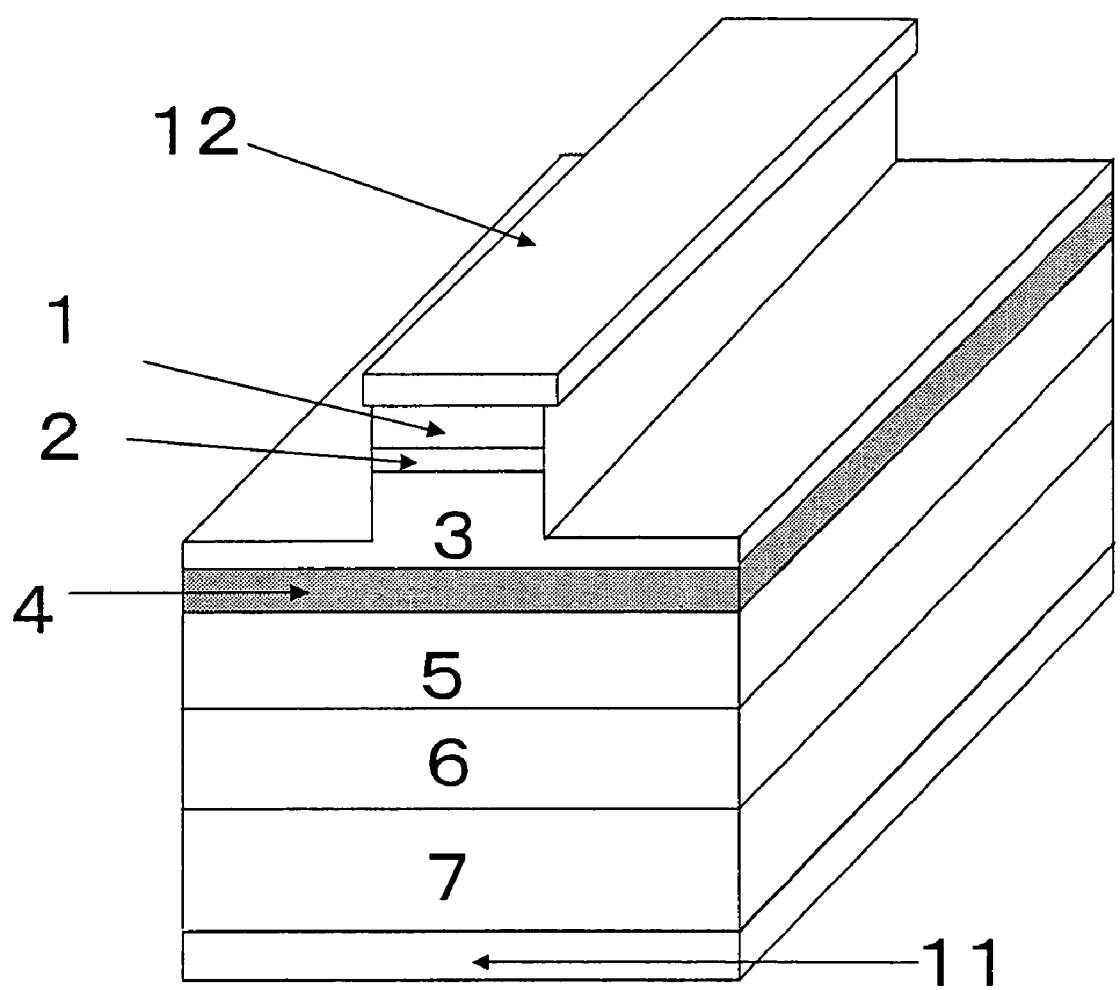
FIG. 6 is a perspective view showing the third embodiment according to the present invention.

FIG. 6 is a perspective view showing the third embodiment according to the present invention. This embodiment exemplifies the application of the layer structure shown in FIG. 1 or 2 to a ridge waveguide type semiconductor laser device.

The n-type buffer layer 6, the n-type cladding layer 5, the active layer 4, the p-type cladding layer 3, the p-type BDR layer 2, and the p-type cap layer 1 are formed on the substrate 7 of an n-type GaAs in this sequence.

The p-type cladding layer 3, the p-type BDR layer 2, and the p-type cap layer 1 are formed in a ridge shape using etching or the like. On the upper face of the p-type cap layer 1, a p-side electrode 12 is provided, and on the lower face of the substrate 7, an n-side electrode 11 is provided.

The p-type BDR layer 2 may include either such a single layer with the p-type dopant concentration of $2.5 \times 10^{18}$ cm$^{-3}$ or more, as shown in FIG. 1, or the higher concentration layer 2a, adjacent to the p-type cap layer 1, with a p-type dopant concentration of $2.5 \times 10^{18}$ cm$^{-3}$ or more, as shown in FIG. 2. This configuration can maintain a lower differential resistance of the device and suppress the diffusion phenomenon of the p-type dopant into the active layer 4, thereby preventing degrading of the laser characteristics.

Embodiment 4

Figure 7:
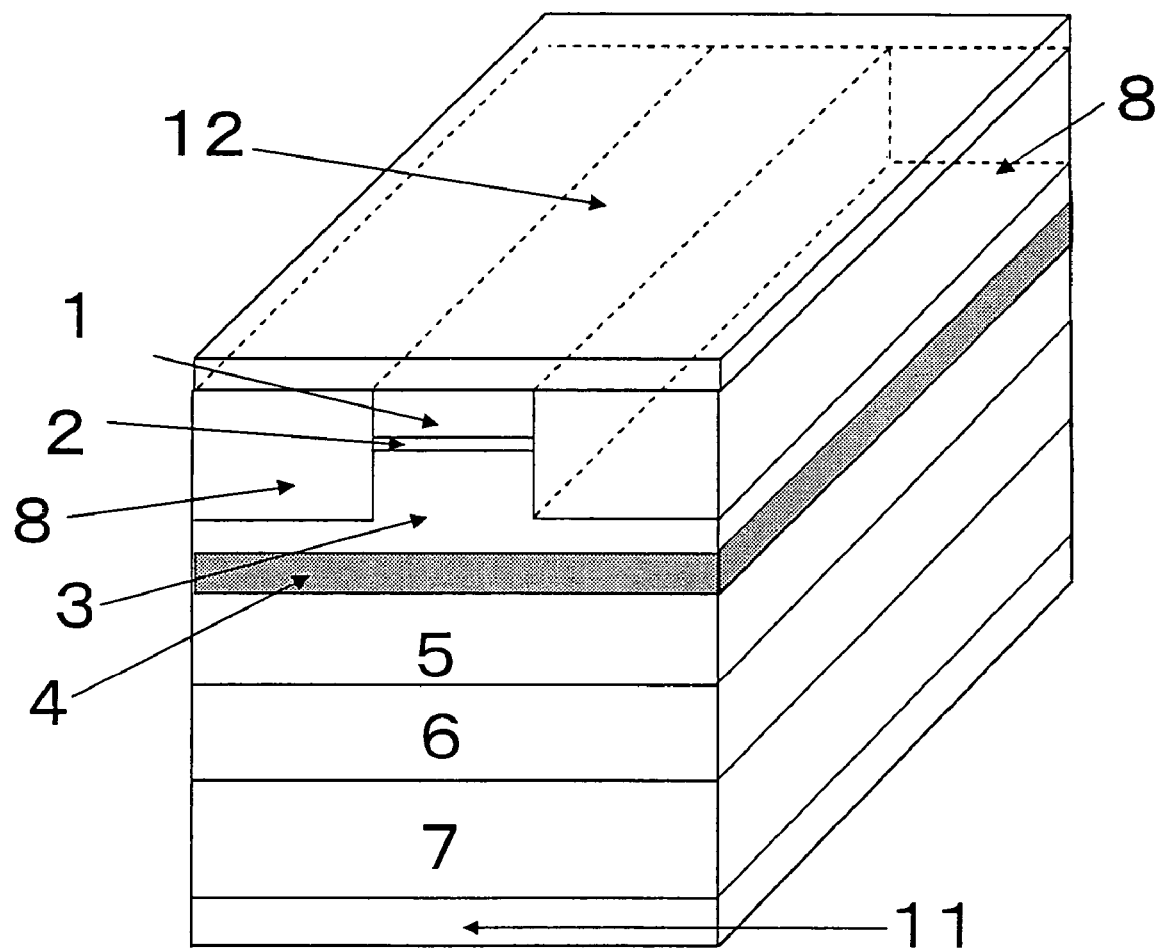
FIG. 7 is a perspective view showing the fourth embodiment according to the present invention.

FIG. 7 is a perspective view showing the fourth embodiment according to the present invention. This embodiment exemplifies the application of the layer structure shown in FIG. 1 or 2 to a current confinement type semiconductor laser device.

The n-type buffer layer 6, the n-type cladding layer 5, the active layer 4, the p-type cladding layer 3, the p-type BDR layer 2, and the p-type cap layer 1 are formed on the substrate 7 of an n-type GaAs in this sequence.

The p-type cladding layer 3, the p-type BDR layer 2, and the p-type cap layer 1 are formed in a ridge shape using etching or the like. An n-type current block layer 8 is formed on each side of the ridge to concentrate a carrier current into the ridge. On the upper faces of the p-type cap layer 1 and the n-type current block layer 8, a p-side electrode 12 is provided, and on the lower face of the substrate 7, an n-side electrode 11 is provided.

The p-type BDR layer 2 may include either such a single layer with the p-type dopant concentration of $2.5 \times 10^{18}$ cm$^{-3}$ or more, as shown in FIG. 1, or the higher concentration layer 2a, adjacent to the p-type cap layer 1, with a p-type dopant concentration of $2.5 \times 10^{18}$ cm$^{-3}$ or more, as shown in FIG. 2. This configuration can maintain a lower differential resistance of the device and suppress the diffusion phenomenon of the p-type dopant into the active layer 4, thereby preventing degrading of the laser characteristics.

Incidentally, each embodiment as described above exemplifies the p-type cladding layer 3 and the p-type BDR layer 2 doped with Mg and the p-type cap layer 1 doped with C (carbon). Alternatively, the p-type cladding layer 3 may be doped with such low-diffusive Be as Mg. The p-type BDR layer 2 may be doped with such low-diffusive Be as Mg. The p-type cap layer 1 doped with low-diffusive Mg or Be as C. These cases also can obtain the same effect as the present invention.

Although the present invention has been fully described in connection with the preferred embodiments thereof and the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor laser device comprising:
   an n-type cladding layer, an active layer, and a p-type cladding layer, each of the active, n-type cladding, and p-type cladding layers being a III-V compound semiconductor, and supported by a substrate of n-type GaAs;
   a p-type band discontinuity reduction layer of a III-V compound semiconductor, on the p-type cladding layer; and
   a cap layer of p-type GaAs on the p-type band discontinuity reduction layer, wherein
   the p-type cladding layer, the p-type band discontinuity reduction layer, and the p-type cap layer are sequentially arranged in the order listed and are each doped with a p-type dopant which is lower in diffusivity than Zn, and
   the p-type band discontinuity reduction layer has a concentration of the p-type dopant lower in diffusivity than Zn of at least $2.5 \times 10^{18}$ cm$^{-3}$.

2. The semiconductor laser device according to claim 1, wherein
   the p-type cladding layer is doped with one of Be and Mg as a p-type dopant which is lower in diffusivity than Zn,
   the p-type band discontinuity reduction layer is doped with one of Be and Mg as a p-type dopant which is lower in diffusivity than Zn, and
   the p-type cap layer is doped with one of C, Be, and Mg as a p-type dopant which is lower in diffusivity than Zn.

3. A semiconductor laser device comprising:
   an n-type cladding layer, an active layer, and a p-type cladding layer, each of the active, n-type cladding, and p-type cladding layers being a III-V compound semiconductor, and a substrate of n-type GaAs;
   a p-type band discontinuity reduction layer of a III-V compound semiconductor on the p-type cladding layer; and
   a cap layer of p-type GaAs on the p-type band discontinuity reduction layer, wherein
   the p-type cladding layer, the p-type band discontinuity reduction layer, and the p-type cap layer each are doped with a p-type dopant which is lower in diffusivity than Zn, and
   the p-type band discontinuity reduction layer includes a first layer, adjacent to the p-type cap layer, with a concentration of a p-type dopant which is lower in diffusivity than Zn of at least $2.5 \times 10^{18}$ cm$^{-3}$, and a second layer, adjacent to the p-type cladding layer, with a concentration of the p-type dopant lower than the dopant concentration in the first layer.

4. The semiconductor laser device according to claim 3, wherein the first layer of the p-type band discontinuity reduction layer has a thickness of 20% to 80% of the total thickness of the p-type band discontinuity reduction layer.

5. The semiconductor laser device according to claim 3, wherein
   the p-type cladding layer is doped with one of Be and Mg as a p-type dopant which is lower in diffusivity than Zn,
   the p-type band discontinuity reduction layer is doped with one of Be and Mg as a p-type dopant which is lower in diffusivity than Zn, and
   the p-type cap layer is doped with one of C, Be, and Mg as a p-type dopant which is lower in diffusivity than Zn.

6. The semiconductor laser device according to claim 1, wherein the III-V compound semiconductors are selected from the group consisting of GaAs, AlGaAs, AlGaInP, and GaInP.

7. The semiconductor laser device according to claim 3, wherein the III-V compound semiconductors are selected from the group consisting of GaAs, AlGaAs, AlGaInP, and GaInP.

8. A method for manufacturing a semiconductor laser device including:
   forming an n-type cladding layer, an active layer, and a p-type cladding layer of a III-V compound semiconductor, sequentially, on a substrate of n-type GaAs;
   forming a p-type band discontinuity reduction layer of a III-V compound semiconductor on the p-type cladding layer;
   doping the p-type band discontinuity reduction layer with a p-type dopant while halting forming of any layer; and
   forming a cap layer of p-type GaAs on the p-type band discontinuity reduction layer.

9. The method according to claim 8, including doping the p-type cladding layer, the p-type band discontinuity reduction layer, and the p-type cap layer with a p-type dopant which is lower in diffusivity than Zn.

10. The method according to claim 8, including
   doping the p-type cladding layer and the p-type band discontinuity reduction layer with one of Be and Mg, and doping the p-type cap layer with one of C, Be, and Mg.

* * * * *